United States Patent [19]

Barjhoux

[11] Patent Number: 4,958,282

[45] Date of Patent: Sep. 18, 1990

[54] 3-D IMAGE RECONSTRUCTION USING FOURIER TRANSFORMATION WITH DIFFERING RESOLUTIONS OF IMAGE AXES

[75] Inventor: Yves Barjhoux, Gif sur Yvette, France

[73] Assignee: General Electric CGR S.A., Paris, France

[21] Appl. No.: 215,812

[22] Filed: Jul. 6, 1988

[30] Foreign Application Priority Data

Jul. 10, 1987 [FR] France ............................ 87 09814

[51] Int. Cl.$^5$ ...................... G01N 24/08; G01R 33/20
[52] U.S. Cl. .................................. 364/413.13; 324/309
[58] Field of Search .............................. 324/309–312; 364/413.13, 413.2

[56] References Cited

U.S. PATENT DOCUMENTS 4,698,592 10/1987 Feinberg ............................ 324/309

FOREIGN PATENT DOCUMENTS 0091008 10/1983 European Pat. Off. .
0100183 2/1984 European Pat. Off. .

Primary Examiner—Clark A. Jablon
Attorney, Agent, or Firm—Oblon, Spivak, McClelland, Maier & Neustadt

[57] ABSTRACT

An image reconstruction method of the 3DFT type is proposed wherein the organization of the excitation and measuring sequences comprises the repetition of macro-sequences. During the macro-sequences, a selection encoding gradient which may have a small number of encoding steps (in particular, smaller than the expected resolution of the images) is applied. It is shown that this approach enables the best possible of the power and flexibility of the vectorial processors used to perform image reconstruction computations efficiently. It is shown that the images can then be produced in real time.

7 Claims, 3 Drawing Sheets

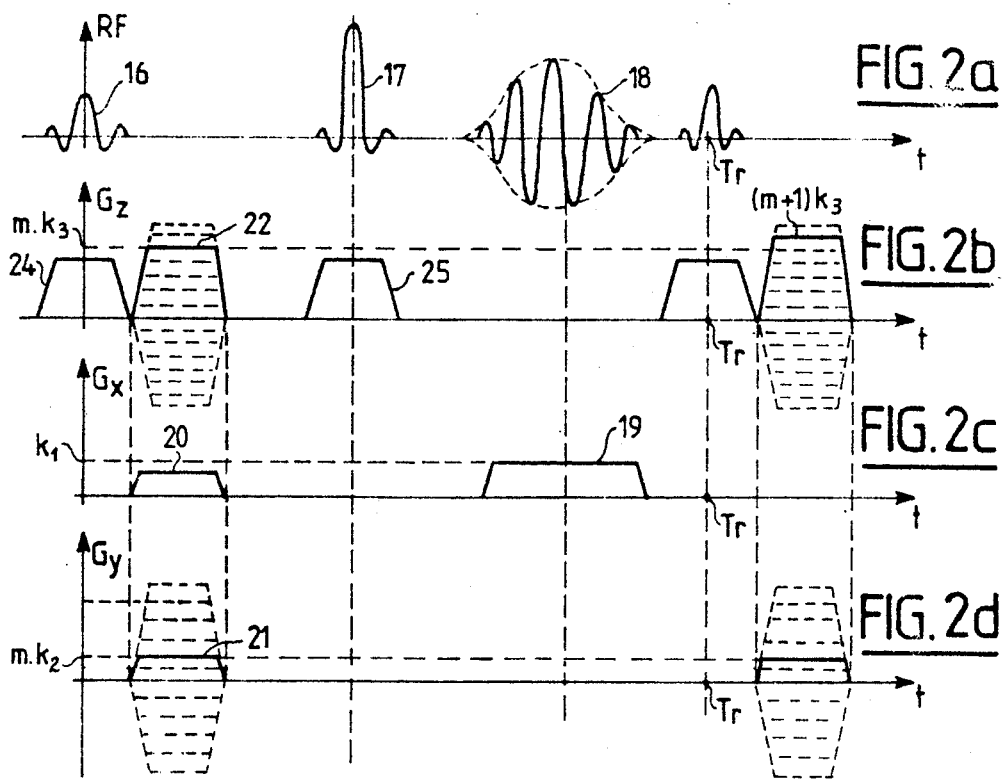

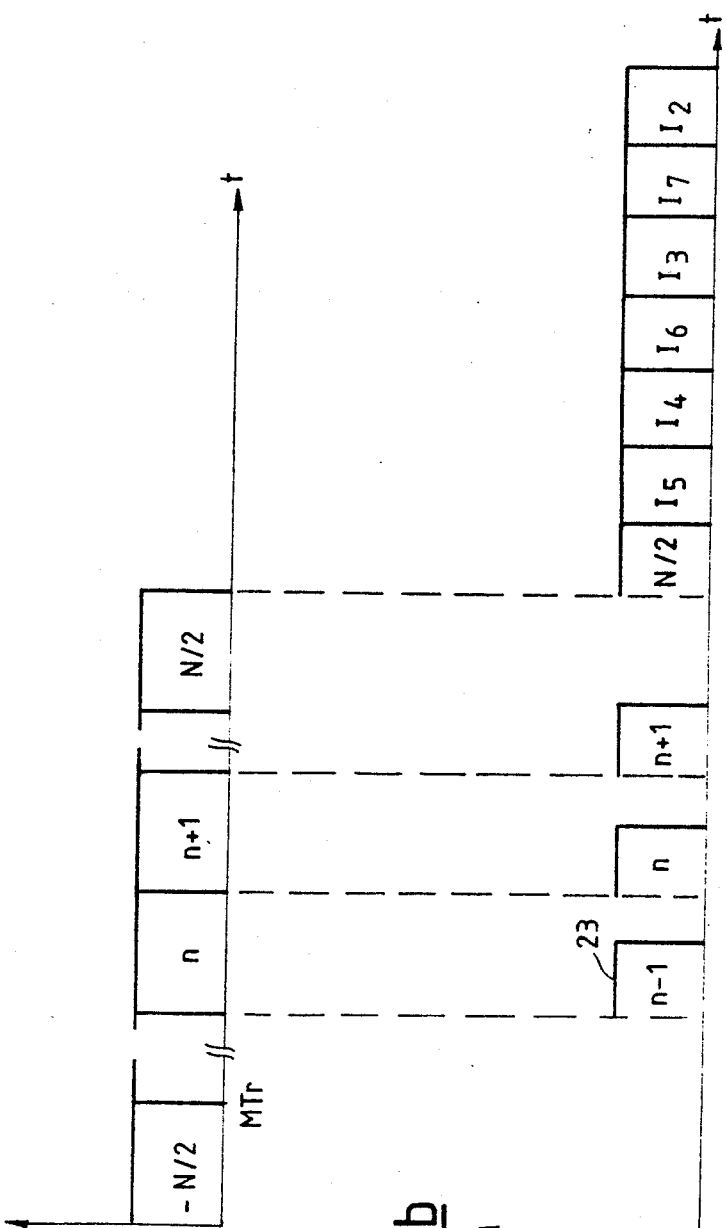

3-D IMAGE RECONSTRUCTION USING FOURIER TRANSFORMATION WITH DIFFERING RESOLUTIONS OF IMAGE AXES

BACKGROUND OF THE INVENTION

1. Field of the Invention

An object of the present invention is a method for the reconstruction of images acquired by 3D experiments, especially in nuclear magnetic resonance (NMR). The method of the invention is especially applicable to NMR spectrometry or X-ray spectrometry. It can be transposed to image reconstruction computations used in tomodensitometry. Among all the reconstruction methods envisaged, the so-called 3 DFT reconstruction method is particularly referred to herein. Imaging methods using 3D acquisition, called 3D imaging methods, have many advantages as compared with two-dimensional or 2D acquisition methods with the selection of cross-sections in the bodies examined. In particular, they make it possible to propose thin, contiguous cross-sections with contours that are undistorted by supplementary steps in the method, which are required in order to define this cross-section. However, as compared with 2D methods, they have the disadvantage of requiring prohibitively lengthy periods for the acquisition and reconstruction of images.

2. Description of the Prior Art

Recent improvements in methods for the excitation of the magnetic moments of protons, known as steady state free precession (SSFP) methods, have considerably reduced 3D acquisition means. The time taken to present images then depends essentially on the time taken for reconstruction. Typically, there are known ways of showing images with resolutions that are substantially equal along two reference axes of the image. However, for an axis oriented in a direction perpendicular to the images, along the stack of these images, either a less efficient resolution is accepted (in the final analysis relatively thick slices, for example 1 cm slices, are chosen), or else the volume in which it is sought to make these images is restricted. Assuming, for example, that the body of a patient is stretched out in an NMR machine along an axis Z and that the aim is to make images of cross-sections of this body with resolutions in each image of, for example, $256 \times 256$ pixels, it is possible to accept, for example, a depiction of only eight images superimposed along the axis Z. This typical digital example shall be kept in the rest of the description of the invention because it gives a clear picture of the subject. Of course, the implications of the invention cannot be considered to be limited to this digital example.

The implementation of a 3DFT type imaging method calls for the application of excitation and measurement sequences which comprise, firstly, a radiofrequency electromagnetic excitation of the body to be examined and the measurement of a resulting NMR de-excitation signal and, secondly, the application of additional magnetic field gradient pulses (superimposed on the main magnetic field of the machine), for which the gradient directions are pre-determined with respect to the directions of the images of the sections to be obtained (in this case, cross-sections). It is known that, during the measurement of the NMR signal, a so-called read gradient is applied along a pre-determined axis of this type called a read axis. In general, the read axis is called the X-axis. During the 3D experiment, the field gradients applied to a so-called phase encoding axis (Y) and a cross-section selection axis (Z) assume different values from one sequence to another. For instance, there is a known method by which the cross-section selection gradient is fixed at a given value and for a given period during each sequence of a first series of sequences, while the phase encoding gradient value changes step by step during the first series of sequences. When the first series of sequences is acquired, the value of the cross-section selection gradient is incremented and the entire series of sequences is repeated. During the sequences of this other series, the phase encoding gradient again assumes the same series of values as for the first series of sequences. This series of frequencies is started again for as many times as it is sought to obtain images counted in the direction of stacking on the axis (Z). At the end of each series of sequences, 2D Fourier transform is used to compute the contributions to the final images. These contributions are thus acquired in each of these series of sequences. When all the contributions to the images have been computed, the image elements on all the images are computed by Fourier transform from these contributions to the images. Typically, each contribution image is defined on a space of $256 \times 256$ points. The computations of the final images then require, in the example, the performing of $8 \times 256 \times 256 = 524288$ one-dimensional Fourier transforms (or $256 \times 256 = 65536$ Fourier transforms) for which the number of computing points in each is small: it corresponds to a small number (eight) of series of sequences which itself corresponds to the small number of images sought to be depicted in the stack.

This method has many drawbacks. In particular, performing a very large number of Fourier transforms, with a small number of computing points, is ill suited to the vectorial processors used. For these processors are normally optimized to perform greater numbers of computing points. In practice, we thus arrive at an image reconstruction time of about 12 minutes in the example referred to above. Furthermore, the acquisition mode is such that, during this reconstruction period, no intermediate result is available: all the images are computed and available at the same time. This means that this waiting time cannot be used to interpret images which would be presented as and when they arise. Furthermore, in view of the number of data to be processed simultaneously, the addressing problems encountered to implement these reconstruction methods are great.

Finally, in the image, it is not always necessary to choose one and the same resolution along both axes. For example, it might be decided to produce images with $256 \times 128$ pixels. An additional problem would then be encountered. For, this reduction in resolution along one of the axes of the image, which reduces the measurements acquisition time by two, is counterbalanced by the fact that there are no standard programs in the vectorial processors used for reconstruction processing by 2D Fourier transform of non-symmetrical sets. Since there is no pre-recorded program available that works according to a fast algorithm, a specific algorithm has to be programmed. This specific algorithm cannot be as well suited to the machine as the fast algorithm for which the machine was itself designed. The result of this is that the expected time gain is not obtained.

An object of the invention is to remove the drawbacks referred to by modifying the organization of the acquisition of sequences as well as the organization of the computing of image reconstruction. In this computation, advantage is taken of the fact that, in one of the acquisition dimensions, the image resolution or the number of images is small. In practice, instead of first performing symmetrical 2D Fourier transforms (for example, 256×256) asymmetrical Fourier transforms (for example 8×256) are performed. However, vectorial processors are generally designed to work with a low-capacity fast memory and a high-capacity slower memory. In the invention it has been observed that the computation of highly asymmetrical 2D Fourier transforms makes it possible, by using the entire useful volume of the fast memory, to use vectorial processors to their maximum working speed. Subsequently, a third one-dimensional Fourier transform is performed with a large number of computing steps (256), and this large number too corresponds to a maximum use of the computing power of the vector processor. The result of this is that by making the processor work to its maximum capacity at all times, images are produced faster than by burdening it with an excessively large number of operations which, in particular, would be too simple for its capacity. A large number of to and fro movements between the processor and the slow memory are avoided.

SUMMARY OF THE INVENTION

An object of the invention, therefore, is a method for the reconstruction of images acquired by a 3DFT type imaging method for which the resolution M along one of the imaging axes is smaller than the resolutions N and P along two other axes of the image, said method comprising a first computation of N.M.P Fourier transforms with P computation steps followed by a second computation of N.M.P. Fourier transforms with M computation steps followed by a third computation of N.M.P. Fourier transforms with N computation steps.

BRIEF DESCRIPTION OF THE DRAWINGS

The invention will be better understood from the following description and the accompanying figures which are given purely by way of example and in no way restrict the scope of the invention. Of these figures:

FIGS. 2a to 2d show timing diagrams of gradient signals of encoding magnetic fields used in the method according to the invention;

FIGS. 3a and 3b show the shape of the temporal distributions of various phases of the method according to the invention.

DESCRIPTION OF THE PREFERRED EMBODIMENT

Figure 1:
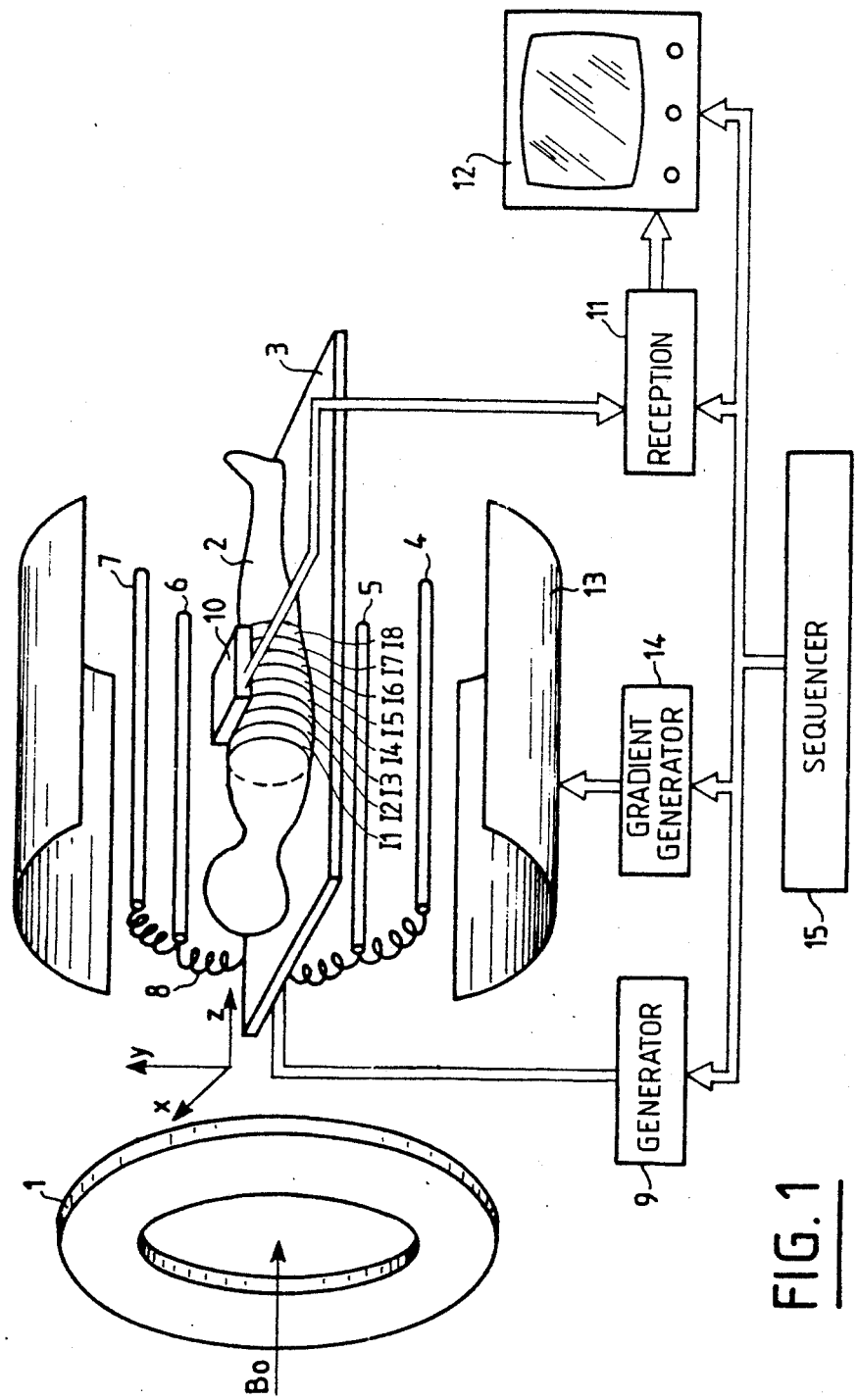
FIG. 1 shows an NMR machine which can be used to implement the method according to the invention.

FIG. 1 shows an NMR machine for the application of the method of recording in accordance with the invention. This machine essentially comprises a magnet represented by a coil 1 for producing a uniform magnetic field $B_o$ of high strength in a zone of examination. This zone of examination is located in the region in which a patient's body 2 is placed on a table 3. When subjected to this magnetic influence, the body 2 is further subjected to a radiofrequency electromagnetic excitation transmitted by an antenna consisting, for example, of radiating rods 4 to 7 and fed through an oscillating circuit 8 by an excitation generator 9. An antenna 10 serves to collect the de-excitation signal of the magnetic moments of the body's protons. In certain cases, the antenna 10 may be identified with the excitation antenna. The detected signal is conveyed on a reception and processing circuit 11 in order to depict images of the sections $I_1$ to $I_8$ on a display screen 12. In order to implement the 3DFT imaging method, the machine further has gradient coils symbolized by the coils 13 powered by a gradient pulse generator 14. All these means work under the control of a sequencer $I_5$. FIG. 1 again shows axes XYZ. It is seen that the images will be developed along the axes X and Y and stacked on one another along the axis Z. Besides, the functions of these axes may be inverted or even combined so as to produce images of any particular orientation.

FIGS. 2a to 2d show the shape of the radiofrequency signal and the shape of the field gradient pulses along each of the axes Z, X, Y, respectively, during an excitation and measurement sequence used in the invention. During a sequence of this type, a radiofrequency excitation 16 has the effect of making the orientation of the magnetic moments of the particles of the body flip over. If necessary, a radiofrequency pulse, called a spin echo pulse 17, is also applied to make the NMR signal of the body reappear at 18. At the end of a period Tr, a following sequence is undertaken. In the invention, the sequences are brought together in macro-sequences and all the macro-sequences constituting all the experimenting sequences.

A macro-sequence comprises a reduced number M of identical sequences in all their elements except for the value of a selection encoding gradient $G_z$. In fact, from one sequence to another, on a read axis X the read gradient $G_x$ is kept identical: it consists of a read encoding pulse 19 and a read pre-coding pulse 20. Throughout the experiment, this gradient pulse is constant. During all the sequences of a macro-sequence, the phase encoding gradient $G_y$ preserves a same value $n.k_2$. This macro-sequence is called the order n macro-sequence. In the experiment, there are N macro-sequences (typically N is equal to 256), and n is equal to $-N/2$, to $+N/2$ (strictly speaking n should not assume values except between $-N/2$ and $N/2-1$. To simplify the presentation, the $-1$ has been omitted. Besides, the same applies to M and P). By contrast, during the macro-sequence, at each of the sequences, the pulse 22 of a selection encoding gradient changes from a value $m.k_3$ to a following $(m+1).k_3$. In an imaging sequence there are M sequences (typically M is equal to 8) and m can take the values of $-M/2$ to $+M/2$.

FIGS. 3a and 3b show the course of all the imaging sequences according to the invention. There are N macro-sequences, the elementary duration of which is M.Tr each time. After M sequences of a macro-sequence, a first computation of the 2D Fourier transform 23 is done. It will be shown further below that, because of the number of computing steps implied in this 2D Fourier transform computation, this computation can be easily completed before the end of the following macro-sequence. In practice, with the values given in the example and taking a duration of about 50 milliseconds as the duration $T_r$, a macro-sequence lasts 400 milliseconds (all the 256 macro-sequences then last about 2 min) while the computation of the 2D transform with the fast memory of the vector processors used, lasts about 40 milliseconds each time. In other words, while the macro-sequence n is acquired, the 2D Fourier transform can be computed on the results of the acquisition relating the macro-sequence $n-1$. This leads, firstly, to work in effective real time, and, secondly, a limit on addressing constraints: it is possible, if necessary, to re-use same addresses of the fast memory during the 2D Fourier transform computation in the macro-sequences.

Further below, we shall recall, albeit with some mathematical simplifications, the theoretical architecture for the computing of image reconstruction by 3D acquisition using the 3DFT method, as well as the modification resulting therefrom through the invention. Since this is a sequence where the phase encoding gradient is equal to $n.k_2$, and where the selection encoding gradient is equal to $m.k_3$, the signal 18 given as a function of time can be converted into a sequence of samples, evenly distributed in time and equivalent to a number P. P represents the resolution of the images to be obtained developed along the axis X. In these conditions, signal 18 is converted into a signal $S(p, n.k_2, m.k_3)$.

According to its principle, the computing of reconstruction by Fourier transform requires three steps. The effect of the first step is to transform $S(p,n.k_2,m.k_3)$ into:

$$S_{x0}(n \cdot k_2, m \cdot k_3) = \sum_{p=-P/2}^{p=P/2} e^{-j \cdot p \cdot k1 \cdot x0} S(p, n \cdot k_2, m \cdot k_3)$$

Here, the Fourier transforms are transforms approximated by discrete summations on the P samples. In the rest of the explanation as well as in the claims, the term Fourier transform will designate the computation thus relating to a summation, hence, in this case, for a value of $x_0$. Each Fourier transform has P computing points since p varies from $-P/2$ to $+P/2$. In each macro-sequence, there are P.M Fourier transforms such as this one, since there are P possible values of $x_0$ and because there are M values of m. At the end of the acquisition, when N macro-sequences have been acquired, then N.M.P Fourier transforms such as this one have been performed with P computing points. In fact, during each interval 23, the second step of the Fourier transform computation, wherein $S_{x0}$ becomes $S_{x0\ z0}$, is performed. This computation is written as follows:

$$S_{x0\ z0}(n \cdot k_2) = \sum_{m=-M/2}^{m=M/2} e^{-j \cdot m \cdot k3 \cdot z0} S_{x0}(n \cdot k_2, m \cdot k_3)$$

These latter Fourier transforms are Fourier transforms with M computing points. In the invention, M is notably smaller than M or P: in the example indicated, M is equal to eight. Here again, a total of N.M.P one-dimensional Fourier transforms have to be done.

In practice, it is not two computations of one-dimensional Fourier transforms that are done as indicated, but one computation of 2D Fourier transforms, each comprising M.P. computing points. This number M.P. of computing points must be compared with the number N.P. in the prior art where a series of sequences were acquired by varying the phase encoding gradient and by keeping the selection encoding gradient constant. In view of the low value of M, it becomes possible to compute N.M.P 2D Fourier transforms with M.P computing points by using the fast memory of the vectorial processors. A specific algorithm can be used successfully. It is this computation of 2D Fourier transforms which is performed at each macro-sequence during the interval 23.

To complete the image reconstruction computation, all that remains is to calculate $S_{x0\ y0\ z0}$ for all the coordinates x0, y0, z0 of the volume studied in the body with a computation of the following form:

$$S_{x0\ y0\ z0} = \sum_{n=-N/2}^{n=N/2} e^{-j \cdot n \cdot k2 \cdot y0} S_{x0\ y0}(n \cdot k_2)$$

In this latter computation there are M.N.P Fourier transforms with N computing steps in each.

It can be seen, however, that the invention makes it easy to envisage the reconstruction of images for which the resolution along one of the axes (phase encoding axis) is less precise than along the read axis. For example, if N equals 128, the acquisition will last two times less and the time taken for computation of the third Fourier transforms will be shorter. The computations that correspond to these third one-dimensional transforms are illustrated by the dimensions of images $I_2$ to $I_7$ in FIG. 3b. In the invention, the computing time for an image is about 3 seconds (with a resolution of 256 phase encoding steps). The reconstruction of the eight images $I_1$ to $I_8$ theoretically lasts 24 seconds.

The method of the invention has many advantages. Firstly, the total acquisition and reconstruction time is about 2½ minutes. Secondly, the first image can be available 4 seconds after the end of the acquisition and not 12 minutes after as in the prior art referred to. For the computing of an image, which is defined by $z_0$, can be organized by computing the Fourier transforms on all the values of $S_{x0z0}(n.k_2)$ corresponding to one and the same particular $z_0$: for example that of the image $I_1$. It is enough to organize the addressing $S_{x0z0}$ to this end. Furthermore, by known phenomena related to aliasing with respect to images, a part of the image $I_1$ is recovered in the image $I_8$ and reciprocally. These images create interference. It is therefore not necessary to compute them. In the invention, the reconstruction computing of images which are known in principle to be unusable is quite simply eliminated: neither $I_1$ nor $I_8$ are computed. Finally, it can be seen that the invention can be used to choose or to quite simply to first bring out the central image $I_5$ or $I_4$ in the part of the examined volume of the patient. For the central image is most often worthwhile especially when the exploration setting of the machine is centered on it. By computing all the images, it is then possible alternately to produce images located on either side of the central image every three seconds, while at the same time gradually moving away. FIG. 3 shows a typical sequence: $I_5$, $I_4$, $I_6$, $I_3$, $I_7$, $I_2$, the images $I_1$ and $I_8$, for example, being not computed.

To cope with phenomena of aliasing in images, the precaution is also taken, in the invention, of applying the excitation 16, as well as the spin echo excitation 17 at the same time as the selection pulses 24, 25 of a standard type in 2DFT methods. However, here this is done with a greater exploration width so as to restrict the excitation of the phenomenon of resonance at the volume where it is planned to make the images $I_1$ to $I_8$ (FIG. 2b). Ultimately, the object of the selection pulses 24 and 25 is to select the macro-section in which all the images are made.

What is claimed is:

1. A method for the reconstruction of images acquired by NMR experiments on a body to be examined said method comprising for the acquisition of said images:

the execution of N macro-sequences, each of said N macro-sequences comprising M sequences, said sequences being designed for the excitation and measurement of NMR signals from the body, at each sequence, P samples of this NMR signal are measured, said method also comprising, in a vectorial computer, for the reconstruction of the images by a 3DFT type imaging method, for which the resolution M along one of the imaging axes of said images is smaller than the resolutions N and P along two other imaging axes of said images, the following steps in the following order:

a first computation, over samples of said NMR signal, of N.M.P. Fourier transforms with P computation steps, followed by:

a second computation over results given by said first computation, of N.M.P. Fourier transforms with M computation steps, followed by a third computation, over results given by said second computation, of N.M.P. Fourier transforms with N computation steps, the final reconstruction of the images being achieved by the end of said third computation.

2. A method according to claim 1 wherein the first and the second computations of Fourier transforms are combined in a fourth computation of N.M.P. two-dimensional Fourier transforms with M.P. computation steps, said fourth computation being performed in said vectorial processor before said third computation, the final reconstruction of the images remaining achieved at the end of said third computation.

3. A method according to claim 1 or 2 wherein each of said two-dimensional Fourier transforms are computed as soon as are ended macro-sequences which characterize them.

4. A method according to claim 1 or 2 wherein said third computation is limited to the computation of the images which are closest to a central image, this central image being defined with respect to exploration along an axis corresponding to the lowest resolution, to eliminate the images disturbed by phenomena relating to aliasing the images.

5. A method according to claim 4 wherein the images are computed alternately on either side in moving away from the central image.

6. A method according to claim 1 or 2 wherein the experiments comprise, during each sequence, the application of a selection gradient for a macro-section for the application of the excitation.

7. A method according to claim 1 or 2 wherein the reconstruction of the images comprises the reconstruction of a set of images, said images of said set being defined with respect to the exploration of the body according to the two imaging axes corresponding to the highest resolutions N and P, said images of said set being arranged the one with regard to the other according to successive locations, into said body, of a third imaging axis, said images of said set comprising a central image located in the middle of said set and lateral images located on the two sides of said central image, said third imaging axis corresponding to the exploration of the body according to the lowest resolution M, said N.M.P. Fourier transforms of said third computation being arranged to produce firstly said central image and secondly said lateral images.

* * * * *